United States Patent
Shinohara

(10) Patent No.: US 6,358,778 B1
(45) Date of Patent: Mar. 19, 2002

(54) SEMICONDUCTOR PACKAGE COMPRISING LEAD FRAME WITH PUNCHED PARTS FOR TERMINALS

(75) Inventor: Toshiaki Shinohara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/261,488

(22) Filed: Mar. 3, 1999

(30) Foreign Application Priority Data

Sep. 17, 1998 (JP) .......................................... 10-263291

(51) Int. Cl.$^7$ ........................................... H01L 23/495
(52) U.S. Cl. ........................ 438/123; 438/124; 257/666
(58) Field of Search ............................... 438/106, 111, 438/112, 121, 123, 124; 257/666, 676

(56) References Cited

U.S. PATENT DOCUMENTS

| | | | | |
|---|---|---|---|---|
| 5,285,104 A | * | 2/1994 | Kondo ........................ | 257/666 |
| 5,663,593 A | * | 9/1997 | Mostafazadeh et al. ...... | 257/666 |
| 6,002,173 A | * | 12/1999 | Casati et al. ................ | 257/739 |
| 6,034,423 A | * | 3/2000 | Mostafazadeh et al. ...... | 257/691 |
| 6,117,710 A | * | 9/2000 | Mostafazadeh et al. ...... | 438/123 |

FOREIGN PATENT DOCUMENTS

| | | | | |
|---|---|---|---|---|
| EP | 634794 A2 | * | 1/1995 | .......... H01I/23/373 |
| JP | 03-263359 | * | 11/1991 | .......... H01L/23/28 |
| JP | 05-259357 | * | 10/1993 | .......... H01L/23/50 |
| JP | 8139259 | | 5/1996 | .......... H01L/23/50 |
| JP | 2001077266 | * | 3/2001 | .......... H01L/23/50 |

* cited by examiner

*Primary Examiner*—Olik Chaudhuri
*Assistant Examiner*—Anh Duy Mai
(74) *Attorney, Agent, or Firm*—Leydig, Voit & Mayer, Ltd.

(57) ABSTRACT

A method of producing a semiconductor package wherein there are less limitations imposed, on the terminal layout of the lead frame and on the number of terminals, and resinous burrs are not made on the lower surface of the terminals.

First, such portions of the lead frame 1 that would make terminals 2 and die pads 3 are formed by using a die in a half-punched protruding configuration on the semiconductor device 4 mounting side thereof. Then the semiconductor device 4 is mounted on the lead frame 1 and the electrodes of the semiconductor device 4 and the protruding terminals 2 are connected by means of wires 5. After sealing the semiconductor device 4 mounting side of the lead frame 1 with a resin seal 7, unnecessary portions of the lead frame 1, namely portions other than the terminals 2 and the die pad 3, are removed by a mechanical means.

10 Claims, 6 Drawing Sheets

SEMICONDUCTOR PACKAGE COMPRISING LEAD FRAME WITH PUNCHED PARTS FOR TERMINALS

BACKGROUND OF THE INVENTION

1. Field of the Invention

The present invention relates to a semiconductor package having a semiconductor device such as integrated circuit mounted thereon, and a method of producing the same.

2. Description of the Related Art

A method of producing a semiconductor package of the prior art will be described below with reference to FIGS. 5A–5B. FIG. 5A is a partially cutaway view showing a semiconductor package prior to the removal of unnecessary portions of a lead frame thereof, FIG. 5B is a cross sectional view showing the semiconductor package shown in FIG. 5A, and FIG. 5C is a cross sectional view showing the semiconductor package being completed. In the drawings, numeral 11 denotes the lead frame, 22 denotes a terminal of the lead frame 11, 3 denotes a die pad area of the lead frame 11 whereon a semiconductor device is to be mounted, 4 denotes a semiconductor device, 5 denotes a wire for connecting an electrode (not shown) of the semiconductor device 4 and the terminal 22, 6 denotes a die bonding material for bonding the semiconductor device 4 onto the die pad 3, and 7 denotes a sealing resin.

The method of producing a semiconductor package of the prior art will be described below. The terminals 22 and the die bond pad 3 are part of the lead frame 11, consisting of a thin metal sheet and formed by etching or stamping. The semiconductor device 4, such as an IC is fastened onto the die bond pad 3 by means of the die bonding material 6. Then the electrodes of the semiconductor device 4 and the terminals 22 of the lead frame 11 are electrically connected by means of wires 5, such as gold wire. Further, the sealing resin 7, such as epoxy resin, is formed using a sealing mold, and the terminals 22 are cut off from the lead frame 11 on the outside of the sealing resin 7, thereby completing the semiconductor package shown in FIG. 5C. A metal ball may be provided on an exposed surface of the terminal 22 on the bottom face of the package. Alternatively, a configuration that may also be employed as the die pad 3 is lifted in the direction of top surface of the package and, after forming the resin seal, the die pad 3 is embedded in the sealing resin 7.

In the semiconductor package of the prior art where the terminals 22, which are external terminals of the package are disposed on the lower surface of the package as described above, the terminals 22 extend to the inside toward the semiconductor device 4, from the lead frame 11 which surrounds the package. Thus the terminals 22 can only be formed in one line along the periphery of the package, while spaces for securing the terminals are required between the terminals 22. Consequently, there has been a limitation on the number of terminals which can be provided. In order to solve this problem, Japanese Patent Kokai Publication No.139259/1996, for example, discloses a lead frame in which external terminals are arranged in a 2-dimensional configuration, for example in a lattice configuration, along the lead forming surface, which is made by applying a resist on a thin metal sheet used for making the lead frame after cleaning it, and performing exposure, development and etching processes using appropriate patterns. However, this method employs a photolithographic step for making the lead frame and therefore ensures high processing accuracy but requires complicated steps thus leading to a high production cost.

The semiconductor package of the prior art also has a problem in that the resin is squeezed into a space between the lower surface of the terminals 22 and the mold by the pressure of the resin during the forming process by the resin forming mold in contact with the lower surface of the terminals 22, thus leading to the formation of resinous burrs 8 shown in FIG. 6 which require removal after molding.

SUMMARY OF THE INVENTION

The present invention has been accomplished to solve the problems described above, and an object of the present invention is to provide a method of producing a semiconductor package wherein there are fewer limitations imposed on the terminal layout of the lead frame and on the number of terminals, and resinous burrs are not formed on the lower surface of the terminals, thereby making it possible to obtain a semiconductor package which allows a high degree of freedom in the design of terminals and a high productivity.

The method of producing the semiconductor package according to the present invention comprises the steps of forming at least such portions of a lead frame that would make terminals by using a die in a condition of being punched halfway in a protruding configuration on the side thereof where a semiconductor device is to be mounted; mounting the semiconductor device on the lead frame to connect electrodes of the semiconductor device with the protruding terminals; covering the semiconductor device mounting side of the lead frame with a resin to seal it; and separating to remove unnecessary portions of the lead frame.

The present invention also provides a method comprising the steps of forming a plating film of an individual metal such as Ni, Cu, Ag, Au and Pd or a combination thereof on the lead frame surface; forming at least such portions of a lead frame that would make terminals by using a mold in a condition of being punched halfway in protruding configuration on the side thereof where a semiconductor device is to be mounted; mounting the semiconductor device on the lead frame to connect electrodes of the semiconductor device with the protruding terminals; covering the semiconductor device mounting side of the lead frame with a resin to seal it; and separating to remove unnecessary portions of the lead frame.

The present invention also provides a method comprising the steps of forming a plating film of an individual metal such as Ni, Cu, Ag, Au and Pd or a combination thereof on the lead frame surface; forming a resin film having high heat resistance on the side thereof where semiconductor device is to be mounted; forming at least such portions of a lead frame that would make terminals by using a mold in a condition of being punched halfway in protruding configuration on the side thereof where semiconductor device is to be mounted; removing the resin film from at least the top surfaces of the protruding terminals of the lead frame; mounting the semiconductor device on the lead frame to connect electrodes of the semiconductor device with the protruding terminals; covering the semiconductor device mounting side of the lead frame with a resin to seal it; and separating to remove unnecessary portions of the lead frame.

The present invention also provides a method wherein the unnecessary portions of the lead frame are separated to remove by a mechanical means.

The present invention also provides a method wherein the unnecessary portions of the lead frame are separated to remove by a chemical means.

The present invention also provides a method wherein the electrodes of the semiconductor device and the terminals are connected by wire bonding using thin metal wires of gold, aluminum or the like.

The present invention also provides a method wherein the electrode s of the semiconductor device and the terminals are connected by flip chip bonding using bumps made of solder, gold or an electrically conductive resin.

The semiconductor package according to the present invention is made by one of the methods of producing the semiconductor package described above, and comprises a semiconductor device mounted on a lead frame; a wire or bump for electrically connecting electrodes of the semiconductor device and terminals of the lead frame; and a resin seal for covering the semiconductor device mounting side of the lead frame.

The terminals of the lead frame are disposed in a plurality of lines along the periphery of the semiconductor device mounting area.

The lead frame is made of a copper alloy.

According to the present invention, as described above, at least such portions of a lead frame that would make terminals are formed in half-punched protruding state on the side thereof where a semiconductor device is to be mounted by using a die, then after covering the semiconductor device mounting side of the lead frame for sealing with a resin, unnecessary portions of the lead frame are separated and removed. Thus limitations imposed on the number of terminals and the layout thereof are reduced and the degree of freedom in the design of the terminals is increased while the occurrence of resinous burrs on the lower surface of the terminals is eliminated, so that the resinous burr removing step of the prior art can be omitted and therefore productivity can be improved.

DESCRIPTION OF THE PREFERRED EMBODIMENTS

Embodiment 1

Figure 1A:
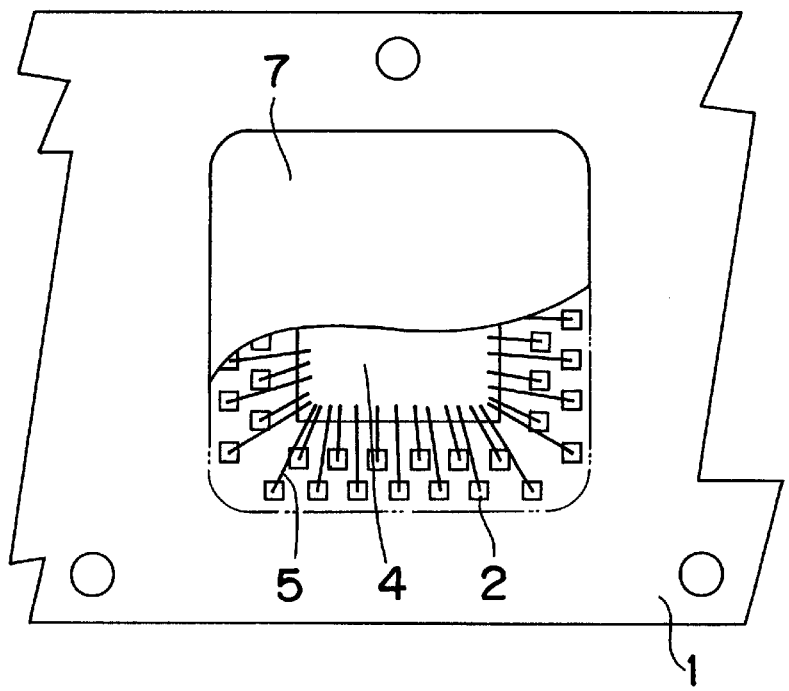
FIGS. 1A–1C are diagrams explaining the method of producing the semiconductor package according to a first embodiment of the present invention.
Figure 1B:
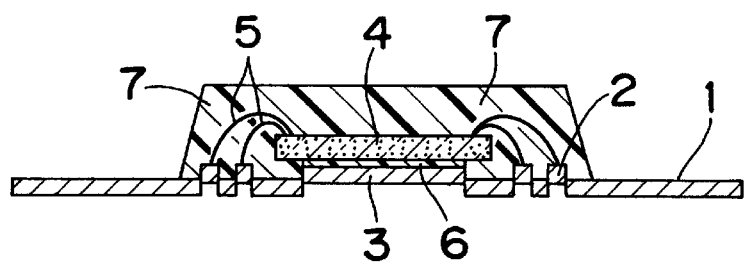
Figure 1C:
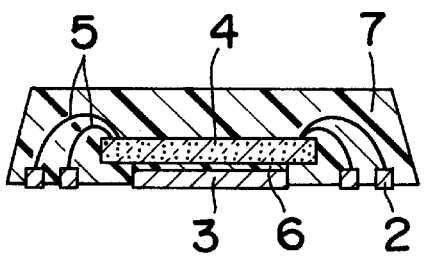

Now, a first embodiment of the present invention will be described below with reference to the accompanying drawings. FIGS. 1A–1C are diagrams for explaining the method of producing the semiconductor package according to this embodiment. FIG. 1A is a partial cutaway view showing a semiconductor package before removing the unnecessary portions of the lead frame. FIG. 1B is a cross sectional view showing the semiconductor package shown in FIG. 1A. FIG. 1C is a cross sectional view showing the semiconductor package which has been completed. In the drawings, numeral 1 denotes a lead frame made of, for example, a copper alloy, 2 denotes a terminal portion of the lead frame 1, 3 denotes a die pad for mounting a semiconductor device on the lead frame 1, 4 denotes a semiconductor device, such as an IC mounted on the die pad 3, 5 denotes a wire electrically connecting the electrode (not shown) of the semiconductor device 4 and the terminal 2 of the lead frame 1, 6 denotes a die bonding material bonding the semiconductor device 4 to the die pad 3, and 7 denotes a resin which covers the semiconductor device 4 mounting side of the lead frame 1.

The method of producing the semiconductor package according to this embodiment will be described below. First, such portions of the lead frame 1 made of a thin metal sheet that would make at least terminals are formed by punching using a die, into a halfway protruding configuration on the semiconductor device 4 mounting side. In this embodiment, the portions which become the terminals 2 and the die pad 3 are so punched (FIG. 1B). While the terminals 2 are made in rectangular shape in this embodiment, the terminals may also be made in circular or other configurations. Also, the die pad 3 is made smaller than the semiconductor device 4 in this embodiment, but the die pad may also have a size equal to or greater than the semiconductor device 4.

Figure 2A:
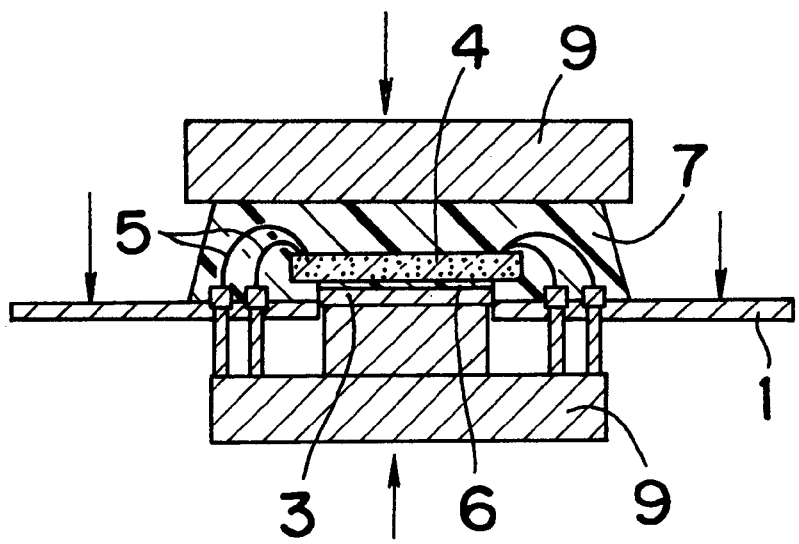
FIGS. 2A–2B are cross sectional views explaining the method of producing the semiconductor package according to the first embodiment of the present invention.
Figure 2B:
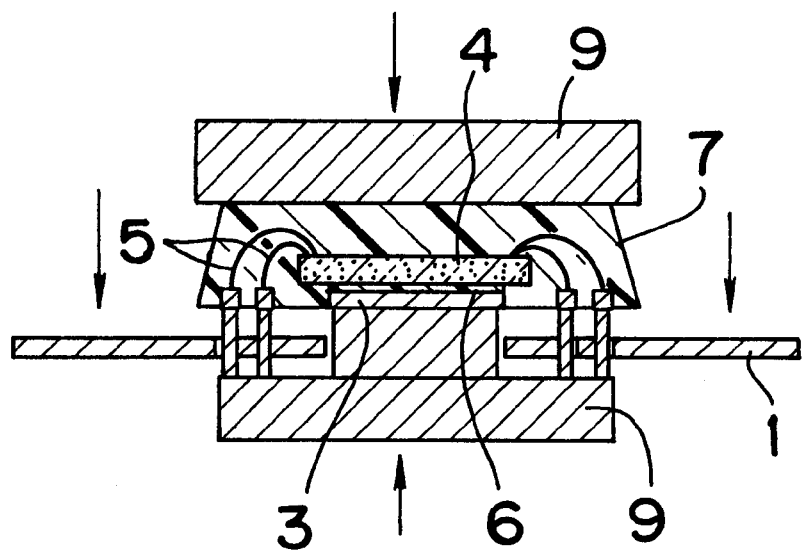

Then the semiconductor device 4 is mounted on the lead frame 1 and the electrodes of the semiconductor device 4 and the protruding terminals 2 are connected to each other. In this embodiment, the semiconductor device 4 is fastened onto the die pad 3 of the lead frame 1 by using the die bonding material 6, while the electrodes of the semiconductor device 4 and the protruding terminals 2 are connected by wire bonding using the wires 5 which are thin metal wires made of gold, aluminum or the like. Then the semiconductor device 4 mounting side of the lead frame 1 is covered with the resin 7 using a resin forming mold. Unnecessary portions of the lead frame 1, the portions other than the terminals 2 and the die pad 3 in this case, are separated and removed by a mechanical means, thereby completing the semiconductor package of this embodiment (FIG. 1C). The mechanical means here refers to a means for cutting off the unnecessary portions of the lead frame 1 (FIG. 2B) while mechanically supporting the terminals 2 and the die pad 3 by means of a holding fixture 9 (FIG. 2A).

In addition to the method of producing the semiconductor package described above, a plated film of an individual metal such as Ni, Cu, Ag, Au and Pd or a combination thereof may be formed on the surface of the lead frame 1, before half-punching the terminals 2 and the die pad 3 of the lead frame 1. Moreover, a resin film having high heat resistance may be laminated on the semiconductor device 4 mounting side of the lead frame 1 which is coated with the plated film, the terminals 2 and the die pad 3 of the lead frame 1 are half-punched and then the resin film is removed from at least the protruding terminals 2 of the lead frame 1, in this case from the top surfaces of the terminals 2 and the die pad 3. The resin film should have a heat resistance sufficient to endure a temperature of, for example, about 230° C. in the wire bonding step and the resin, sealing step that follow, and a lower strength of bonding with the sealing resin 7, so that the sealing resin 7 and the unnecessary portions of the lead frame 1 can be easily separated when removing the unnecessary portions of the lead frame 1.

Figure 3:
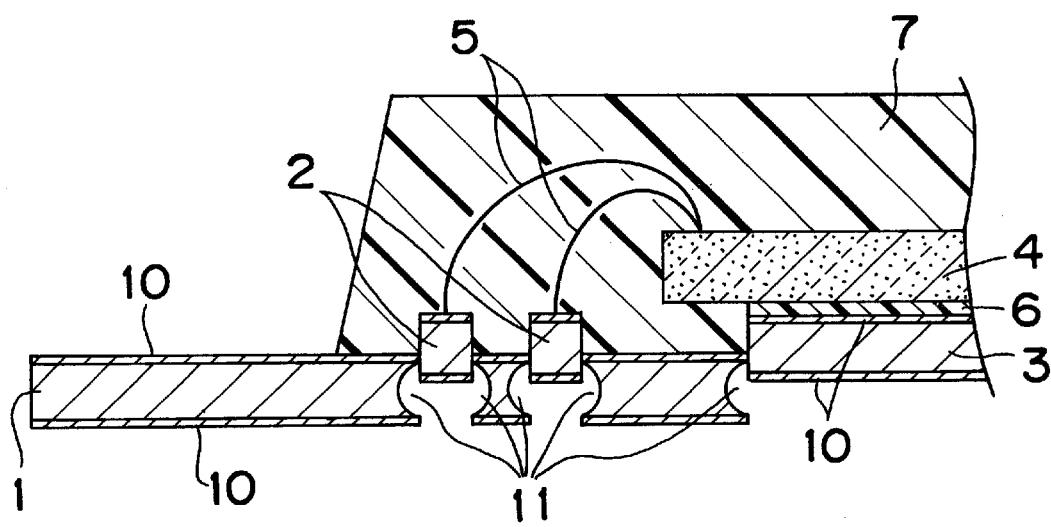
FIG. 3 is a cross sectional view explaining the method of producing the semiconductor package according to the first embodiment of the present invention.

The unnecessary portions of the lead frame 1 coated with the plated film are separated and removed by the mechanical means described above (FIGS. 2A,2B) or chemical means. The chemical means refers to a means for selectively etching the base material exposed in the half-punched portion of the lead frame 1 as shown in FIG. 3. In FIG. 3, numeral 10 denotes a plated film and 11 denotes a portion selectively etched. With this method, because the lead frame 1 is half-punched after being coated with the plated film 10, base material exposed in the half-punched portion is selectively etched, thus making it possible to separate and remove the unnecessary portions of the lead frame 1 without need for the application of resist or photolithographic step such as exposure and development.

The terminals 2 of the semiconductor package of this embodiment may also be provided with metal balls or metal pillars soldered thereon.

Figure 5A:
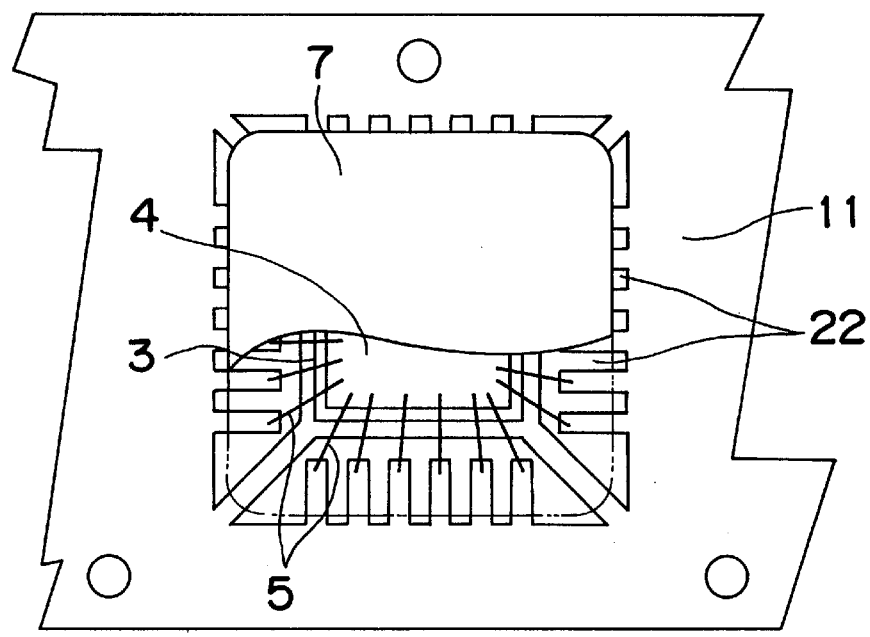
FIGS. 5A–5C are diagrams explaining the method of producing the semiconductor package of the prior art.
Figure 5D:
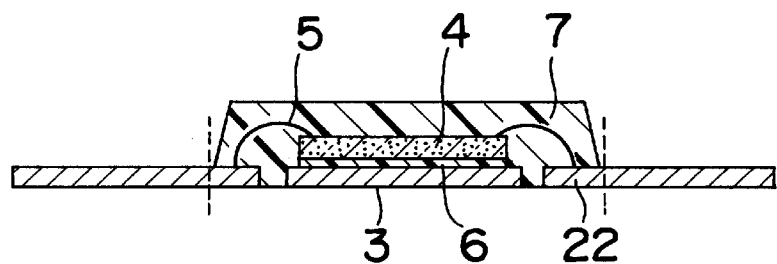
Figure 5C:
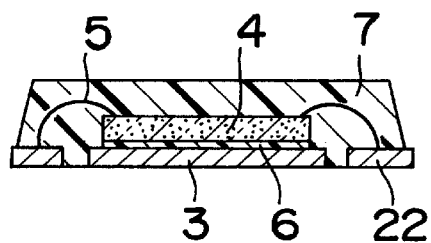
Figure 6:
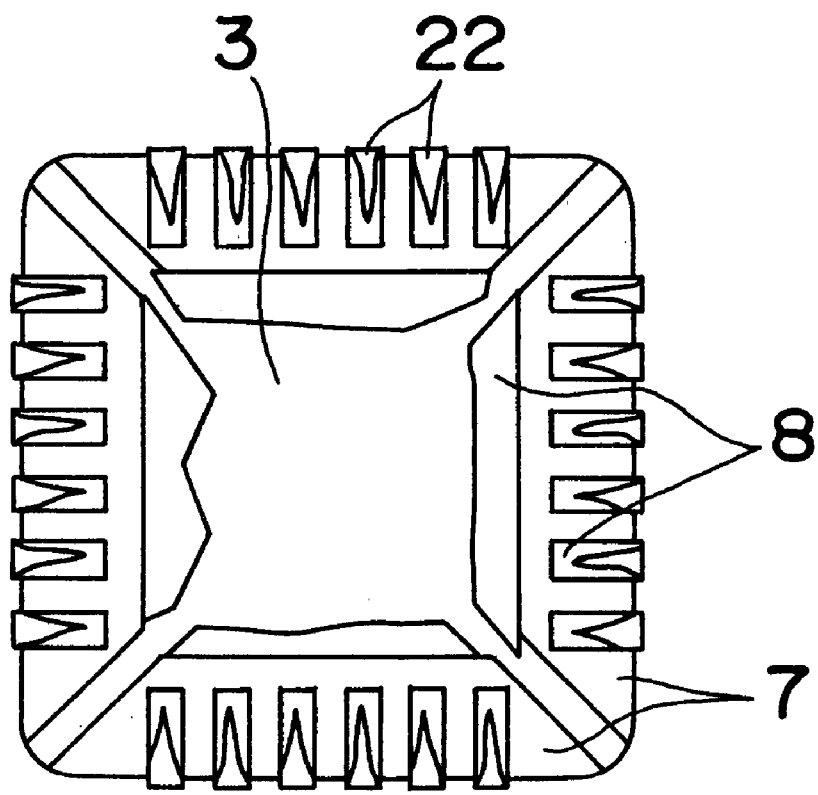
FIG. 6 is a plan view showing the resinous burrs generated on the back surface of the semiconductor package of the prior art.

According to the method of producing the semiconductor package of this embodiment, as described above, because the terminals 2 of the lead frame 1 may be provided at any position and in any configuration desired, limitations imposed on the number of terminals and layout thereof can be greatly mitigated compared to the prior art. While the terminals can only be formed in a line along the periphery of the package in the method of producing the semiconductor package of the prior art shown in FIG. 5, this embodiment makes it possible to arrange the terminals 2 either in one or a plurality of lines along the periphery of the die pad 3. Further, also in the case of removing the unnecessary portions of the lead frame 1 by chemical means, the step is simplified because the photolithographic step is not necessary, thus reducing the production cost. Also because the half-punching of the terminals 2 prevents the sealing resin 7 from being squeezed below the lower surface of the terminals 2 when forming the resin seal, resinous burrs will not be formed. As a result, the step of removing resinous burrs of the prior art can be eliminated, thereby improving productivity.

Embodiment 2

Figure 4A:
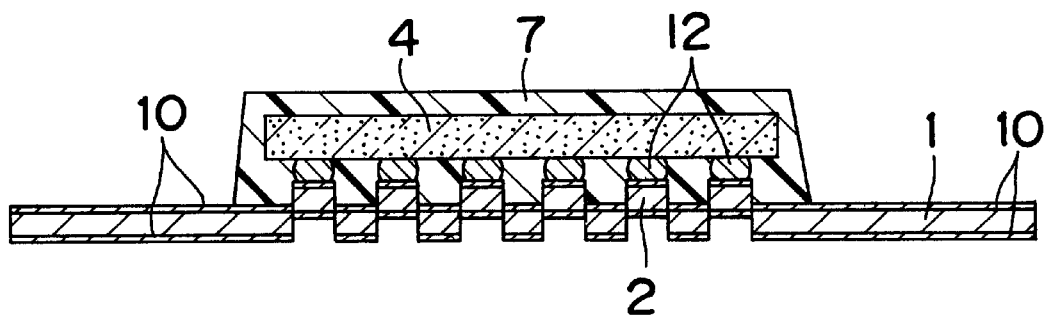
FIGS. 4A–4C are diagrams explaining the method of producing the semiconductor package according to a second embodiment of the present invention.
Figure 4B:
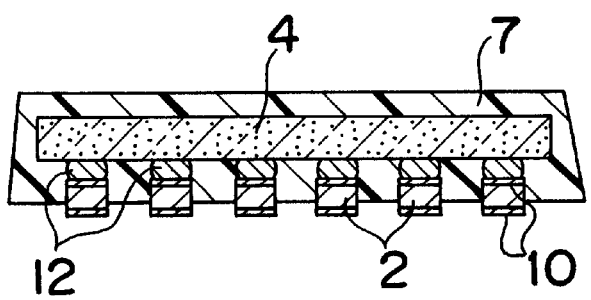
Figure 4C:
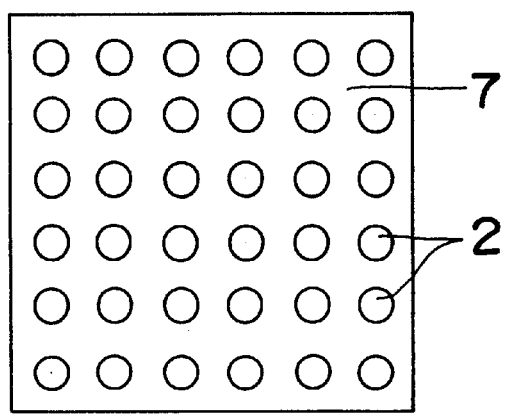

Now the method of producing the semiconductor package according to second embodiment of the present invention will be described below with reference to FIGS. 4A–4C. FIG. 4A is a cross sectional view showing a semiconductor package before removing the unnecessary portions of the lead frame. FIG. 4B is a cross sectional view showing the semiconductor package which has been completed. FIG. 4C is a plan view showing the completed semiconductor package on the back surface thereof. In the drawings, numeral 12 denotes an electrically conductive bump for electrically connecting the electrode (not shown) provided on the lower portion of the semiconductor device 4 and the terminal 2 of the lead frame 1. In the drawing, identical or corresponding portions will be identified with the same numerals and description thereof will be omitted.

The method of producing the semiconductor package according to this embodiment will be described below. First, terminals 2 of the lead frame 1 made of a copper alloy, for example, are punched using a die, into a halfway protruding configuration on the semiconductor device 4 mounting side. Then the semiconductor device 4 is mounted on the lead frame 1 and the electrodes of the semiconductor device 4 and the protruding terminals 2 are connected with each other by flip chip bonding using the bumps 12 made of solder, gold or an electrically conductive resin. The electrodes located on the lower surface of the semiconductor device 4 and the protruding terminals 2 of the lead frame 1 are disposed at mutually corresponding positions, and are electrically and mechanically connected via the electrically conductive bumps 12. The bumps 12 are formed on either one of the electrodes of the semiconductor device 4 and the terminals 2, or on both thereof.

Then the semiconductor device 4 mounting side of the lead frame 1 is covered with the sealing resin 7 for sealing, and unnecessary portions of the lead frame 1, portions other than the terminals 2 in this case, are removed by mechanical means, similar to the first embodiment, thereby completing the semiconductor package of this embodiment (FIG. 4B).

In this embodiment, too, a plated film of an individual metal such as Ni, Cu, Ag, Au and Pd or a combination thereof may be formed on the surface of the lead frame 1. Or, alternatively, a resin film having high heat resistance may be laminated on the semiconductor device 4 mounting side of the lead frame 1 which is coated with the plated film. Unnecessary portions of the lead frame 1 coated with the plated film are separated and removed by the mechanical means or chemical means, similar to the first embodiment.

The terminals 2 of the semiconductor package of this embodiment may also be provided with metal balls or metal pillars soldered onto the exposed surface.

The same effect as that of the first embodiment can also be achieved in this embodiment.

What is claimed is:

1. A method of producing a semiconductor package comprising:

a) forming a lead frame from a metal sheet by punching parts of the metal sheet that become terminals of the lead frame with a die part way through the metal sheet so the parts protrude from a first side of the lead frame on which a semiconductor device is to be mounted;

b) mounting a semiconductor device on the first side of the lead frame and connecting electrodes of the semiconductor device to the protruding parts that become terminals;

c) covering the semiconductor device and the first side of the lead frame with a resin; and d) removing portions of the metal sheet, leaving the terminals.

2. The method according to claim 1, including removing the portions of the metal sheet mechanically.

3. The method according to claim 1, including connecting the electrodes of the semiconductor device to the protruding parts by wire bonding using gold or aluminum wires.

4. The method according to claim 1, wherein the electrodes of the semiconductor device are bumps made of solder, gold, or an electrically conductive resin and including connecting the electrodes of the semiconductor device to the protruding parts by flip chip bonding.

5. The method according to claim 1, comprising, before a),:

plating a film selected from the group consisting of Ni, Cu, Ag, Au, Pd and combinations thereof on the metal sheet.

6. The method according to claim 5, including removing the portions of the metal sheet mechanically.

7. The method according to claim 5, including removing the portions of the metal sheet chemically.

8. The method according to claim 5, further comprising, after e) and before a), forming a resin film having high heat resistance on the first side of the metal sheet; and after a) and before b), removing the resin film from at least the protruding parts.

9. The method according to claim 8, including removing the portions of the metal sheet mechanically.

10. The method according to claim 8, including removing the portions of the metal sheet chemically.

* * * * *